(12) United States Patent
Chan et al.

(10) Patent No.: US 8,146,024 B2
(45) Date of Patent: Mar. 27, 2012

(54) METHOD AND SYSTEM FOR PROCESS OPTIMIZATION

(75) Inventors: Kevin Chan, San Jose, CA (US);
Emmanuel Drege, Los Gatos, CA (US);
Nickhil Jakatdar, Los Altos, CA (US);
Svetlana Litvintseva, San Jose, CA (US); Mark A. Miller, Pleasanton, CA (US); Francis Raquel, Danville, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 586 days.

(21) Appl. No.: 11/612,432

(22) Filed: Dec. 18, 2006

(65) Prior Publication Data

US 2008/0148194 A1 Jun. 19, 2008

(51) Int. Cl.
*G06F 17/50* (2006.01)
(52) U.S. Cl. ........... 716/52; 716/51; 716/53; 716/54; 716/55; 716/56; 430/5; 430/30
(58) Field of Classification Search .......... 716/19–21, 716/50, 51, 52, 53, 54, 55, 56, 112; 430/5, 430/30; 700/121
See application file for complete search history.

(56) References Cited

U.S. PATENT DOCUMENTS

| | | | |
|---|---|---|---|
| 6,562,638 B1 | 5/2003 | Balasinski et al. | |
| 6,610,550 B1 * | 8/2003 | Pasadyn et al. | 438/14 |
| 7,024,638 B2 | 4/2006 | Scheffer et al. | |
| 7,231,628 B2 | 6/2007 | Pack et al. | |
| 7,249,342 B2 | 7/2007 | Pack et al. | |
| 7,302,672 B2 | 11/2007 | Pack et al. | |
| 7,318,214 B1 | 1/2008 | Prasad et al. | |
| 7,418,693 B1 | 8/2008 | Gennari et al. | |
| 2003/0229410 A1 * | 12/2003 | Smith et al. | 700/109 |
| 2004/0059456 A1 * | 3/2004 | Bode et al. | 700/121 |
| 2004/0107412 A1 * | 6/2004 | Pack et al. | 716/19 |
| 2004/0133369 A1 | 7/2004 | Pack et al. | |
| 2005/0015739 A1 | 1/2005 | Scheffer et al. | |
| 2005/0132306 A1 * | 6/2005 | Smith et al. | 716/1 |
| 2005/0216877 A1 | 9/2005 | Pack et al. | |
| 2006/0273266 A1 * | 12/2006 | Preil et al. | 250/548 |
| 2007/0156379 A1 | 7/2007 | Kulkarni et al. | |
| 2007/0233419 A1 | 10/2007 | Pack et al. | |
| 2007/0266364 A1 | 11/2007 | Pack et al. | |
| 2007/0288219 A1 * | 12/2007 | Zafar et al. | 703/14 |
| 2008/0046846 A1 | 2/2008 | Chew et al. | |

OTHER PUBLICATIONS

KLA Tencor, "Accelerates Reticle Design Verification for Sub-100-nm Device Production With Design Process Window Qualification Technology", http://www.kla-tencor.com/product-releases/kla-tencor-accelerates-reticle-design-verification-for-sub-100-nm-device-production-with-design-process-window-qualification-technology.html, San Jose CA, May 7, 2003.

Lin, L. et al., "Etch Process Monitoring by Electron Beam Wafer Inspection", Yield Management Solutions Magazine, http://www.klatencor.com/patterned-wafer/processwindowqualificationpwq.html, Summer 2007.

Office Action dated Apr. 23, 2009 for U.S. Appl. No. 11/612,446.
Office Action dated Mar. 17, 2009 for U.S. Appl. No. 11/612,439.

(Continued)

*Primary Examiner* — Jack Chiang
*Assistant Examiner* — Nha Nguyen
(74) *Attorney, Agent, or Firm* — Vista IP Law Group, LLP

(57) ABSTRACT

A method and apparatus for process optimization is provided. Process optimization improves parametric and functional yield post mask manufacturing.

21 Claims, 8 Drawing Sheets

OTHER PUBLICATIONS

Office Action dated Apr. 17, 2009 for U.S. Appl. No. 11/612,422.
Office Action dated Sep. 12, 2008 for U.S. Appl. No. 11/612,422.
Office Action dated Sep. 23, 2009 for U.S. Appl. No. 11/612,422.
Notice of Allowance dated Nov. 11, 2009 for U.S. Appl. No. 11/612,446.
Notice of Allowance dated Sep. 28, 2009 for U.S. Appl. No. 11/612,439.
Final Office Action dated Apr. 7, 2010 for U.S. Appl. No. 11/612,422.
Notice of Allowance dated Dec. 8, 2011 for U.S. Appl. No. 11/612,422.

* cited by examiner

METHOD AND SYSTEM FOR PROCESS OPTIMIZATION

FIELD OF THE INVENTION

The present invention relates to design for manufacturing (DFM) for the design and production of integrated chips.

BACKGROUND OF THE INVENTION

The production of integrated circuits (IC) requires many different skills using knowledge from various disciplines. This process generally starts with the design of an IC chip, including the various circuit elements, their electrical interconnects, and their physical layout across the chip. The IC design typically describes each layer required to fabricate the IC in a FAB using a photolithographic process. There are generally many layers to an IC chip.

The design is analyzed with respect to its physical layout. For example, wire width may be determined and efficient routing and placement of components may occur. Process model may also be used in analyzing the design. This information usually is obtained from a library provided by the manufacturers.

After an integrated circuit is designed, a photomask is created. A photomask, or more simply a "mask," provides the master image of one layer of a given integrated chip's physical geometries. There are different types of masks, including binary chrome-on-glass, attenuated phase-shifting masks (attPSM) and alternating phase-shifting masks (altPSM). Before being used in a photolithography system to replicate the mask image in reduced size onto a wafer when building the IC, the mask is inspected for defects. Defects found in the mask will often be repaired so that they will not be replicated on or introduce harmful distortions to the chips created from that mask.

The demand to meet shrinking feature size is a challenge faced by the IC industry. Resolution Enhancement Techniques (RET) are applied to masks to meet some photolithographic results due to several factors including 1) mask features being smaller than the wavelength of the stepper, 2) object placement, and 3) shapes in combinations with diffraction limited issues. As more RET is required, manufacturing costs and cycle time increase exponentially.

Up until tapeout, a vast amount of information is available, including, for example, the relation of the physical layout to the design schematic or netlist; individual circuit element models and properties; circuit criticalities; and manufacturing assumptions which were used in the IC design. Furthermore, the information is typically in a design hierarchy of fundamental library base cells, or 'hard IP,' of predesigned and characterized blocks, or 'cores.' Circuit elements at this level may include, for example, transistors, power buses, resistors, capacitors, and interconnects. Logos and manufacturing elements, such as area fill cells, may also be included.

Tapeout is typically the last step in the IC design flow and is the 'handoff' mechanism to manufacturing. Typically, tapeout produces a geometries-only design hierarchical data file in GDS-II stream format. However, a wealth of design knowledge is stripped out into this geometry-only format, and therefore is unavailable to any data file derived from it or any design or manufacturing integration process occurring thereafter.

Yield loss during the semiconductor manufacturing process is very problematic. Linking design knowledge to predict real-world manufacturing processes has not been resolved. There are various approaches to identifying lithography critical areas to monitor on the wafer after printing, but no solution has been suggested to correlate the electrical and physical attributes as a basis for enhancing parametric and functional yields.

Traditionally, enlarging the process yield window has been the goal of DFM, while manufacturing Advanced Process Control (APC) aims to keep the manufacturing process in the process yield window. A current approach utilizes RET Process Window Optimization (PWO) using brightfield imaging wafer defect inspection techniques. RET PWO does not account for parametrically sensitive areas but only focuses on functional areas that are deemed difficult to lithographically print on the wafer surface.

Manufacturers, receiving the mask, manufacture and package the ICs on wafers. The current choice of inline metrology/inspection points on wafer is based on in-house knowledge. Traditionally during full volume manufacturing, ten to twenty sites are selected on the wafer to be inspected. Dimensional excursions outside the control limits of these sites are what triggers a manufacturing process adjustment.

As process nodes shrink to sub 65 nm, the driver for yield loss has shifted from random defects to systematic defects. Systematic defects typically account for more than 80% of yield loss; moreover, parametric defects account for more than 50% of yield loss. The current choice of inline metrology/inspection points on the wafer is based on in-house knowledge. Traditionally during full volume manufacturing, ten to twenty sites are selected on the wafer to be inspected. These ten to twenty sites typically are not adjusted wafer to wafer or lot to lot, and are design independent. Wafer fabrication manufacturers use historical inspection data to determine areas that are presumed to be representative structures for wafer yield.

In house knowledge does not account for parametrically sensitive areas but only focuses on functional areas that are deemed difficult to manufacture. Furthermore, any parametric yield loss is only detected at the end of manufacturing during wafer electrical test.

Therefore, there is a need to allow for more cooperation and sharing of information between the designers and manufacturers. Also, there is a need to improve the accuracy of hot spot determination and selection of inline metrology/inspection points.

SUMMARY OF THE INVENTION

Method and apparatus are disclosed for process optimization for semiconductor manufacturing.

As will be made apparent to those skilled in the art, other and further aspects and advantages of the present invention will appear hereafter.

BRIEF DESCRIPTION OF THE FIGURES

Embodiments of the present invention will be described with reference to the following figures.

DETAILED DESCRIPTION

Modeling and cross correlation of design predicted criticalities for optimization of semiconductor manufacturing include using feedback loops where information from the manufacturing process is provided to a cross correlation engine for optimization of semiconductor manufacturing. In an embodiment, the information developed in manufacturing integrated circuits (ICs) is used by the designers to improve the efficiency and accuracy of future manufactured products. The information may include parametric information, functional information, and hot spots determination. The sharing of information allows for design intent to be reflected in manufacturing metrology space; thus, allowing for more efficient and intelligent metrology.

Currently, there is not much insight in the design when the ICs are being manufactured. When design files are given to manufacturing, not much continuity exist between design and manufacturing. Closing this loop brings manufacturing into design so designers can use actual data from silicon to validate their models to allow for more efficient predictions and calibration. Closing the loop also reduces cycle time. In one embodiment, this process allows for faster time to manufacturing from pilot to full production. In another embodiment, this process allows for faster time to product development.

Design Based Optimization

Figure 1:
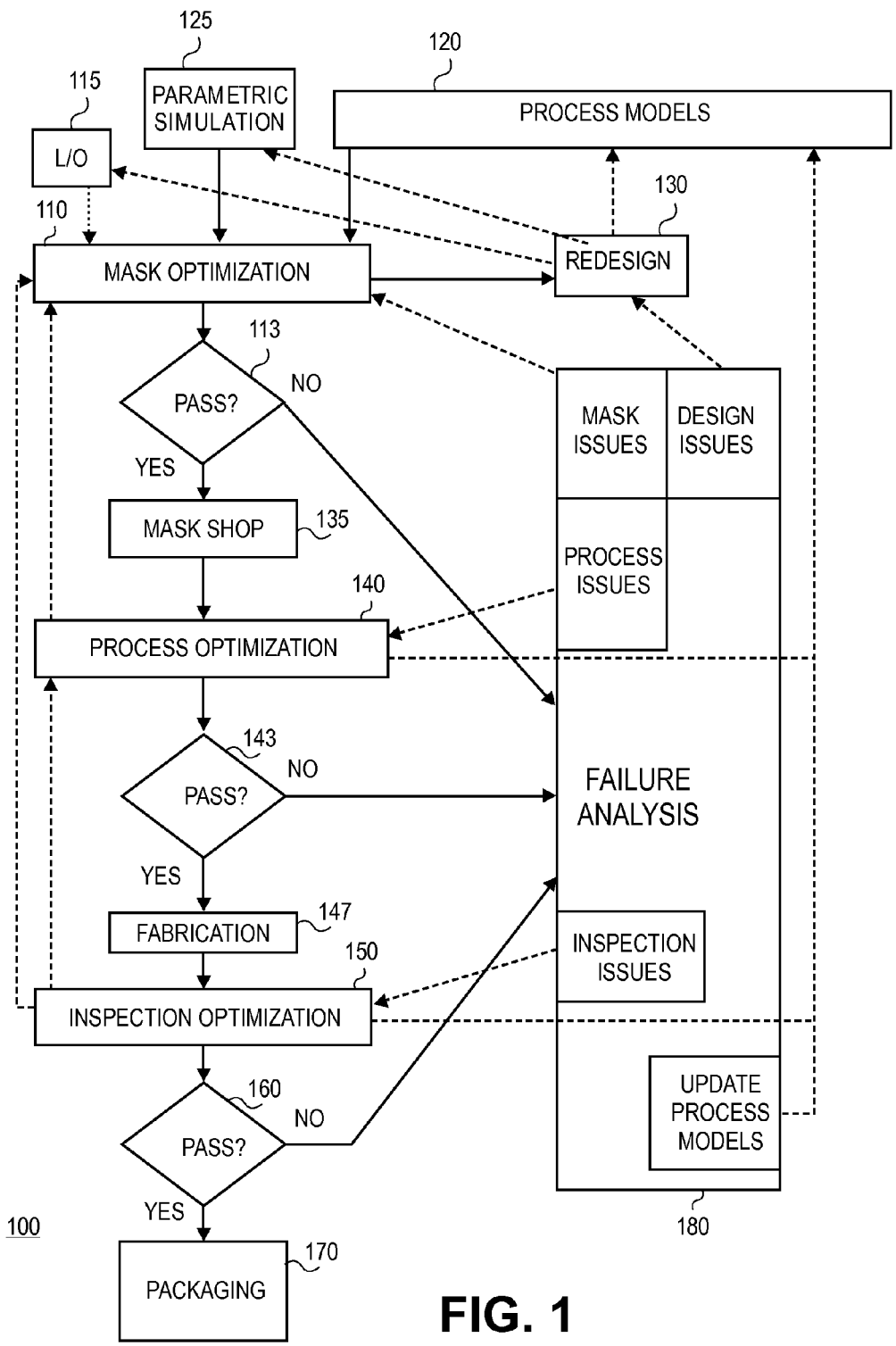
FIG. 1 illustrates a flowchart view of a design for manufacturing process.

FIG. 1 illustrates a flowchart 100 view of a design for manufacturing process flow. Design for manufacturing includes design based manufacturing and manufacturing based design. The combination forms a complete loop that includes the design based manufacturing in the forward direction as well as the manufacturing based design in the feedback direction. Design based manufacturing, illustrated by the solid arrows, uses design knowledge to ensure the quality of the manufacturing. Manufacturing based design, illustrated by the dotted arrows, utilizes information from the manufacturing process to improve the design of the IC. In one embodiment, critical areas or hot spots are simulated and determined so that designers can pay attention in the designing of those areas to try to increase production yield.

The design for manufacturing process flow includes process models 120, layout overlays 115, parametric simulation 125, mask optimization 110, redesign 130, mask shop 135, process optimization 140, fabrication 147, inspection optimization 150, optimization determination 113, 143, 160, packaging 170 and analysis of failure to meet specification 180.

The process models 120 are models of process specific variations. The process models 120 are processing tool specific and include variations resulting from manufacturing. For example, depth of the wires are not considered when designing the physical layout; however, depth varies during fabrication. Therefore, process models provide the designers with the necessary information to improve the accuracy of simulation of their designs by knowing the effects of fabrication on their designs. This knowledge allows the designers to better anticipate the variations and improve the yield of the final product. In one embodiment, these process models 120 are stored in a database. In another embodiment, they are stored remotely from the designers. Any location or storage means may be used. Process models 120 continuously receives updated process model information from the manufacturing process.

The layout overlays 115, a design layout displaying hotspots from different critical domains, includes the physical layout information. These are information that are provided to the designers when they are designing the layout of the IC. In one embodiment, the physical layout is designed using Virtuoso® Layout Editor by Cadence Design Systems, Inc. of San Jose, Calif. Any layout design editor may be used.

Parametric simulation 125 includes the simulation of electrical effects to the layout design. Parametric information includes critical timing paths and IR drop or leakage. In one embodiment, this simulation is performed by First Encounter® technology Cadence Design Systems, Inc. of San Jose, Calif. In another embodiment, IR drop analysis utilizes VoltageStorm® by Cadence Design Systems, Inc. of San Jose, Calif. Any other simulation tool for determining parametric information may be used.

Mask optimization 110 optimizes the design of the mask to ensure the resulting product is what the designer intended. In one embodiment, Mask optimization enhances Optical Proximity Correction (OPC) treatment. In another embodiment, mask optimization provides an existing RET engine with design layout and hot spot location lists as inputs in order to properly weight for critical features during OPC recipe creation. Details of the mask optimization will be described in detail below in FIG. 2.

OPC and RET are examples of possible treatments of mask optimization to enhance the yield of the resulting wafer. Possible treatments are not limited to OPC/RET. Other types of treatments may be implemented with mask optimization.

The resulting optimized mask is sent to decision box 113 where it is determined whether the treatment for the mask of the design is optimized. When the treatment (e.g., OPC/RET) for the design is optimized, the design is sent to mask shop for tapeout. If not, results are analyzed 180. If it is determined that the layout is the cause of the inability for the treatment to be optimized, then the layout needs to be redesigned at redesign 130.

Redesign 130 allows the designer to redesign the layout design. Any additional new information from the redesign may be provided to the process models. Parametric simulation and layout simulation are also performed for the next iteration of the newly design layout.

The mask shop 135 received the treatment information such as the OPC/RET information and the layout design where a mask is produced. This results in a tapeout of the product. Masking techniques for tapeout is performed using conventional methods and techniques. Any method and techniques may be used in producing the mask.

Process optimization 140 attempts to optimize the fabrication process. In one embodiment, process optimization includes improving the parametric and functional yields. In another embodiment, variability is considered. In a further embodiment, the process optimization utilizes process window information from the manufacturer to anticipate the yield resulting from the fabrication of the design layout. The process window is defined according to various criteria based on the process and/or parametric features. For example, on the process side the criteria are dose, focus for lithography, planarity and gradient for CMP. Examples of parametric features are chip frequency, power, IR drop, and electro migration. In another embodiment, this is an optional optimization step. In another embodiment, additional details learned about the process are sent to the process models 120 and mask optimization for future use. Details of the process optimization will be described below in FIG. 4.

In one embodiment, the resulting optimized process information such as a process recipe is provided decision box 143. If the process recipe is determined to have been optimized, then the mask and recipe is sent for fabrication. If the recipe is determined to have not been optimized, then it is analyzed to determine why 180. If it is because of bad design, then the layout will be redesigned 130. If it is because of mask optimization, then mask optimization will be performed again using new process model information. If the mask is unable to be produced (i.e. no manufacturing solution) then the layout design is returned to the mask optimization 110 and/or redesigned. In another embodiment, process optimization is an optional step.

In an embodiment, the optimized process, mask treatment and mask is provided to manufacturer where fabrication occurs 147. The lots of wafers produced are sent to be inspected to determine production yield.

Inspection optimization 150 attempts to improve the efficiency of determining the production yield. In one embodiment, parametric and functional yield are determined using optimized inspection lists for inline semiconductor manufacturing metrology and inspection equipment. The optimized inspection list is a result of statistically optimizing a correlated cross domain inspection list with a parametric and functional yield threshold. During this optimization process, information is provided to the mask optimization and process optimization as well as the process models for future use. Details of the inspection optimization will be described below in FIG. 6.

Decision box 160 determines if the produced wafers meet the manufacturing specification. If it does, then the packaging block 170 is where the final products are packaged. Any packaging process or technique may be used. If the determination 160 results in the wafers failing to meet the manufacturer's specification, then the wafers are analyzed to determine why they failed to meet the specification 180. If the design is at fault, then the layout will need to be redesigned 130. If the mask treatment or the process recipe can be adjusted to increase yield at this particular fab, then the information is returned to mask optimization and process optimization, respectively, to increase future production yield.

The yield for the lots of wafers are determined, for example, by cross correlating hot spots of the most probable locations of parametric and functional critical areas. The accurate determination of yield increases the efficiency of determining whether a wafer meets manufacturing specifications. If the wafer meets the specification, then its ICs are packaged. If not, the wafer is further analyzed to determine why it failed to meet the specification. For example, if the failure to meet specification can be solved by adjusting the layout, then that may be done back at L/O 115 for the future designs. As another example, if the process models information needs to be updated, that information can be sent to process optimization 140 to improve the process for future runs.

Any combination of each embodiments may be used. In one embodiment, only process optimization is used in the design for manufacturing process flow. In another embodiment, only mask optimization is utilized in the design for manufacturing process flow. In a third embodiment, only inspection optimization is used in the design for manufacturing process flow. In a further embodiment, mask optimization and process optimization are utilized in the design for manufacturing process flow. In a fifth embodiment, mask optimization and inspection optimization are utilized in the design for manufacturing process flow. In a sixth embodiment, process optimization and inspection optimization are utilized in the design for manufacturing process flow.

Mask Optimization

Figure 2:
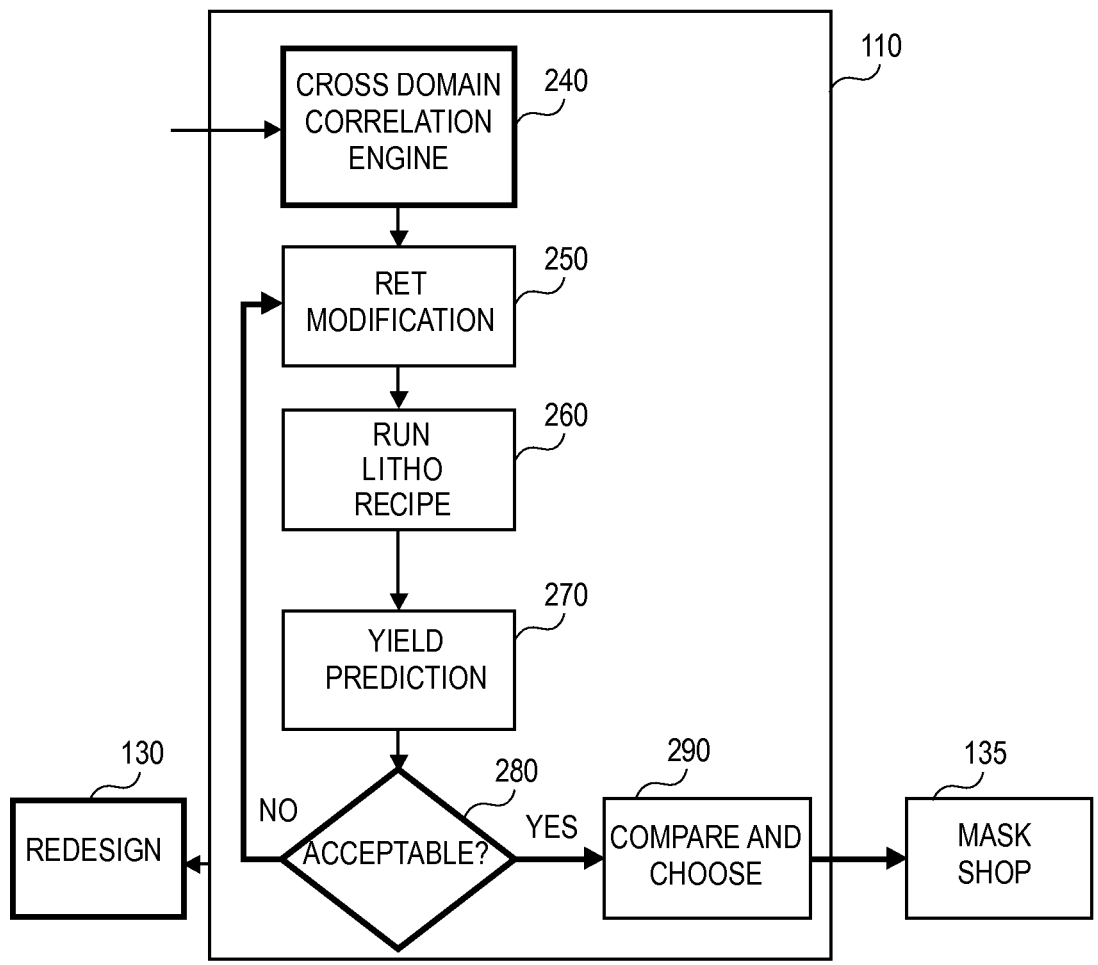
FIG. 2 illustrates a flowchart view of mask optimization according to an embodiment.

FIG. 2 illustrates a flowchart view 200 of a mask optimization according to an embodiment of design for manufacturing process. FIG. 2 outlines the flow and usage of the mask optimization. In one embodiment, mask optimization enhances Optical Proximity Correction (OPC) treatment. In another embodiment, the mask optimization provides an existing RET engine with design input to provide proper weighting for critical features during OPC recipe creation.

Linking design knowledge to improve RET/OPC recipes reduces manufacturing costs as well as optimizes the mask design. Critical features during design phase and manufacturing phase that impact chip performance need to get the maximum RET/OPC weighting to meet lithography goals. The mask optimization 110 methodology takes into account physical as well as parametric attributes to determine critical areas for RET/OPC weighting. In one embodiment, the correlation of several cross domain (i.e., physical and electrical) EDA applications optimizes finding critical areas for RET/OPC weighting. Therefore, mask optimization flow methodology addresses parametric and functional yield.

Mask optimization provides different weighting for RET/OPC correction within the layout. The idea being that non-critical areas get less attention for RET/OPC correction while critical areas get maximum attention for RET/OPC correction. In one embodiment, critical areas or hot spots are manufacturing critical areas that have the most effect to the process yield. In another embodiment, RET/OPC treatment uses all the design data provided by EDA tools such as the electrical attributes and timing analysis to determine the critical areas. The flow uses layout overlay, process simulation, and parametric optimization to improve an RET/OPC baseline recipe.

Mask optimization 110 takes the existing RET/OPC baselines and design data via layout overlay 115, process models 120 and parametric simulation 125 in order to optimize the RET/OPC.

A cross domain-correlation engine 240 utilizes hot spot information with weighting factors to provide a list of more accurate hot spots. In one embodiment, the cross domain correlated engine 240 takes hot spots determined by the design data as inputs, combines them and applies different weighting factors to supply new hot spots, which tags locations within the layout where critical areas need to print as close to the drawn layout relative to other areas not identified as critical. In another embodiment, hot spots calculation is performed and combined with the weighting factors. In a further embodiment, hot spots determined from previous runs or from other portions of the design for manufacturing process flow may be used thereby reducing processing time.

The new hot spots are fed into the RET/OPC engine to optimize the OPC correction. In one embodiment, the weighting is for preserving edge fidelity. Any desired weighting may be used. The RET/OPC is modified 250 based on the weighted hot spots from the cross domain correlation engine 240.

The mask optimization 110 then runs the lithography recipe to determine the result of the mask 260. The mask 260 include the optimization of the RET/OPC.

After running the lithography recipe, a yield is predicted 270. From correlated data of previous runs based on weighting, as well as functional and parametric data from both historic and simulated design and manufacturing data, a prediction of the final product yield is made.

A simulation is performed to determine if the optimized mask can produce the desired product with acceptable yield 280. If there is an improvement over the initial baseline, the new baseline will be kept as a possible candidate for mask manufacturing. If the new baseline is not improved, then the RET/OPC is modified again if treatments are available to further improve the mask by returning to RET/OPC modification 250. If the lack of improvement is due to the layout design, then the IC will need to be redesigned 130. After running all of the RET/OPC baselines through the mask optimization flow, the optimized RET/OPC baseline that shows the best yield prediction 290 is chosen 290 for the mask manufacturing process at the mask shop 135.

Figure 3:
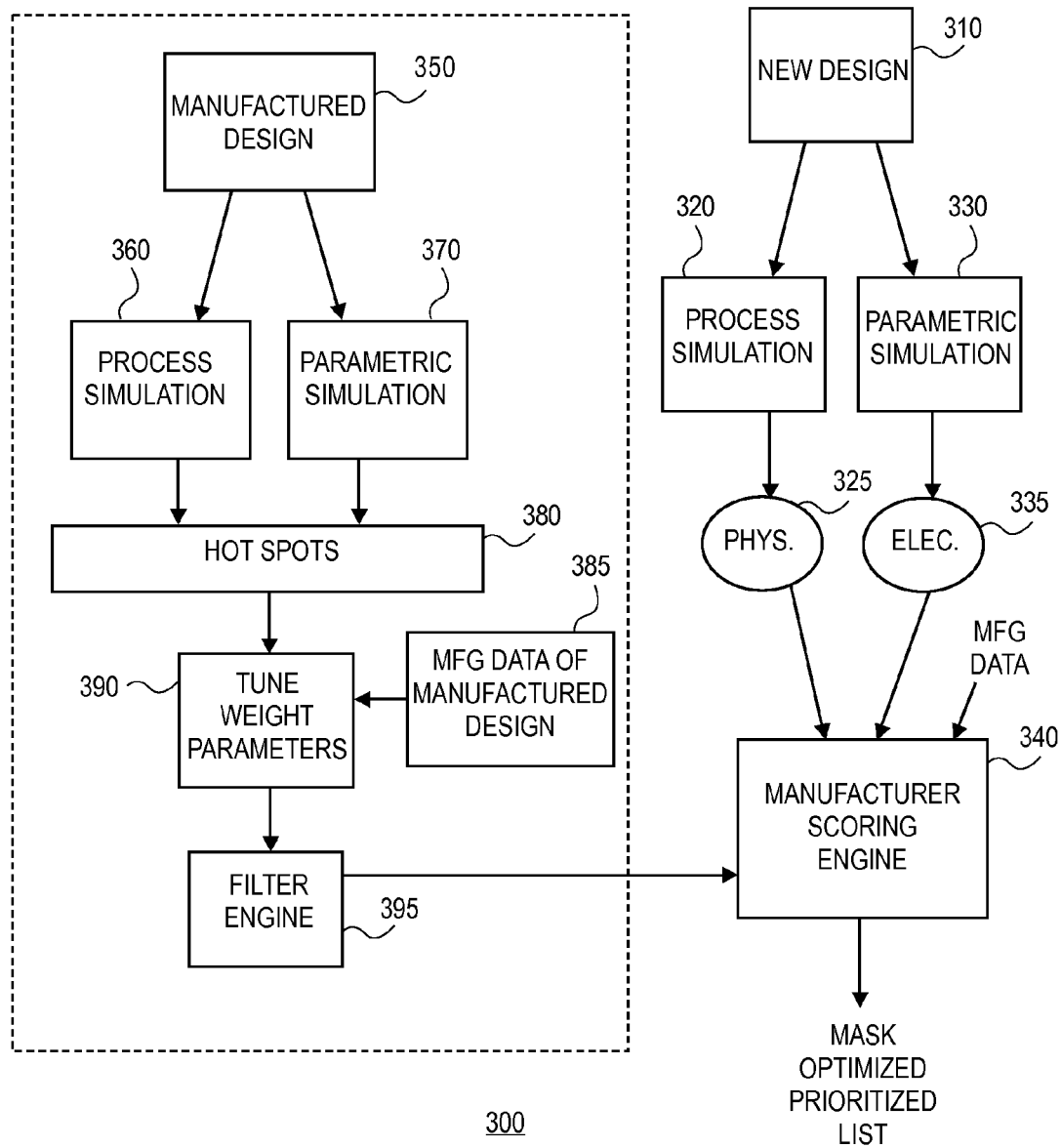
FIG. 3 illustrates a flowchart view of an embodiment of cross domain correlated engine utilized in mask optimization.

FIG. 3 illustrates a flowchart view of an embodiment of the cross domain correlation engine located in the mask optimization.

The mask optimization 110 receives multiple established RET/OPC baselines and each baseline goes through the mask optimization flow. For each RET/OPC baseline, a prioritized list of hot spots are determined by the cross domain correlation engine 240.

A previous IC design fabricated at the manufacturer 350 is simulated for hot spots. In one embodiment, a process simulation 360 and parametric simulation 370 are performed to determine all the hot spots 380. In another embodiment, the previous layout may be an unrelated product run. In other embodiments, other simulation for determining hot spots may be performed.

Because the layout had already been fabricated, the actual hot spots/non-conforming areas on the die and wafer surface are known 385. That information is entered and compared with the location of the simulated hot spots. The weighting parameters are tuned to adjust the location of hot spots 390 such that the locations of simulated hot spots are substantially similar to the location of hot spots determined from the actual manufacturing data 380. Once the simulated and actual hot spot locations are found to be substantially located at the same location, then the weighting parameters are stored. The weighting parameters may put emphasis on the importance of an area of the IC.

The tuning 390 of the weighting parameters adjusts the importance of certain simulated hot spots. In one embodiment, process simulation produces hot spots based on RET, CMP, and the physical layout. Each kind of hot spot could be selected, deselected or given a percentage when determining the weighting. In another embodiment, parametric simulation determines hot spots due to timing, IR drop, and/or electro migration. Again, each one of these hot spots is selectable. The weighting allows for finding a set of hot spots having a union or intersection of these hot spots where each kind of hot spots has a different percentage of importance.

Once the proper weighting to locate the actual hot spots using the simulations are determined, those weighting values are transmitted to the filter engine 395. The filter engine 395 selectively filters for the desired weighting information. This information is sent to the manufacturer scoring engine 340.

The current layout design 310 is also simulated. In one embodiment, process simulation is performed 320. In another embodiment, parametric simulation is performed 330. Other simulations to try to improve the accuracy of the simulation may also be performed. Process simulation 320 is performed to determine the possible critical areas determined by the physical layout 325. Parametric simulation 330 is performed to determine the possible critical areas determined by the electrical effects 335. The physical hot spots and electrical hot spots are transmitted to the manufacturing scoring engine 340. The scoring engine, using the weighting from the manufacturer, predicts the location of the hot spots. The weighting from the filter engine 395 is sent to the manufacturing scoring engine 340. along with the physical and electrical hot spots from the simulations and manufacturing data. Using the weighting factors from the manufacturer and/or the filter engine 395, a mask optimized prioritized list of hot spots locations can be determined for the current layout 310.

The mask optimized priority list is determined using manufactured data, information of the physical 325 and electrical 335 effects and the weighting parameters from the filter engine 395. The manufacturing data is used to compensate for manufacturing drift. The physical and electrical effects provides the manufacturer scoring engine with a list of hot spots caused by different effects. For example, the electrical effects may be due to timing, IR drop, and/or electro migration. Other effects may be due to RET, CMP, physical layout, etc. The simulations result in a list of locations of hot spots for each effect. A union or intersection of the different types of hotspots as well as a set of weighting parameters is used to result in a final set of hot spot locations. As the selection and/or weighting changes the resulting list of hot spot locations will also change. Using the weighting parameters from the filter engine, the resulting prioritized list is likely to represent the actual critical area locations showing the hot spot locations after manufacturing.

Process Optimization

Figure 4:
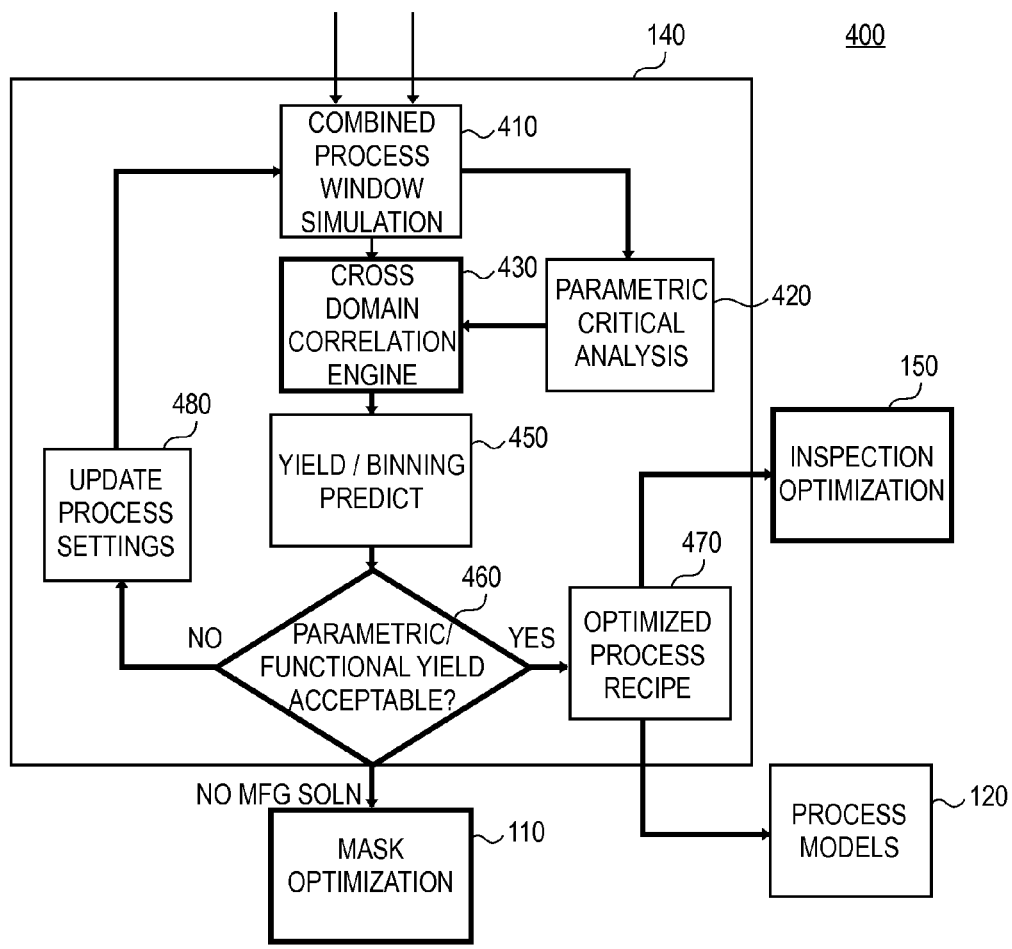
FIG. 4 illustrates a flowchart view of process optimization according to an embodiment.

FIG. 4 illustrates a flowchart 400 view of a process optimization according to an embodiment of design for manufacturing process. Flowchart 400 outlines the flow and usage of Process Optimization. In an embodiment, the process optimizes for parametric and functional yield improvement. In other embodiments, other concerns may be addressed for yield improvement.

Process optimization 140 allows process yield windows to be tightened around critical cross-domain design attributes producing smaller 3-sigma process variation and allows chip manufacturers to better predict binning yields. In one embodiment, process optimization 140 optimizes both the parametric and functional yields after mask manufacturing 135. Typical processes that can be optimized are CMP, lithography and etch steps. In one embodiment, the process optimization applied to the lithographic process optimization generates focus exposure matrices using cross correlated critical features as generated by a correlation engine.

The process optimization flow includes using the combined process window simulation 410. After calibration of the models from manufacturing data, all simulation design outputs are re-generated and combined. Then, parametric critical analysis 420 is performed for the process window.

In an embodiment, cross correlated critical features includes parametric and functional yield. The cross domain correlation engine 430 accepts the physical and layout information from the combined process window simulation as well as electrical effects information from the parametric critical analysis 420. Using the information from the combined process window simulation 410 and parametric critical analysis 420, the parametric yield and functional yield for the lots are predicted 450. In a further embodiment, the cross correlated parametric and functional yield feature set includes an intersection or union of electrically sensitive clocks or timing critical paths to lithography, CMP, etch, doubled vias, or matched transistor pair hot spots as identified by EDA tools.

This prediction 450 is compared with a previous prediction or a baseline to determine whether there has been an improvement over the threshold 460 and/or the process recipe. If the yield is acceptable, then the optimized process recipe is stored for future use 470. The improved process recipe may be provided to the process models 120 and inspection optimization 150. If the yield prediction is not acceptable, then the process settings are adjusted or updated 480 for the next iteration of the combined process window simulation 410. If there is no manufacturing solution (e.g., unable to reach an acceptable functional and/or parametric yield), then mask optimization may need to be performed.

The process optimization allows for multi-variant design based process optimization including process control for both functional and parametric yields using correlated cross domain design attributes. This optimization process improves product binning through earlier detection of potential process control excursions of functional and parametric thresholds and increases operational efficiency of in-line metrology/inspection by allowing for more good dies to be produced.

Figure 5:
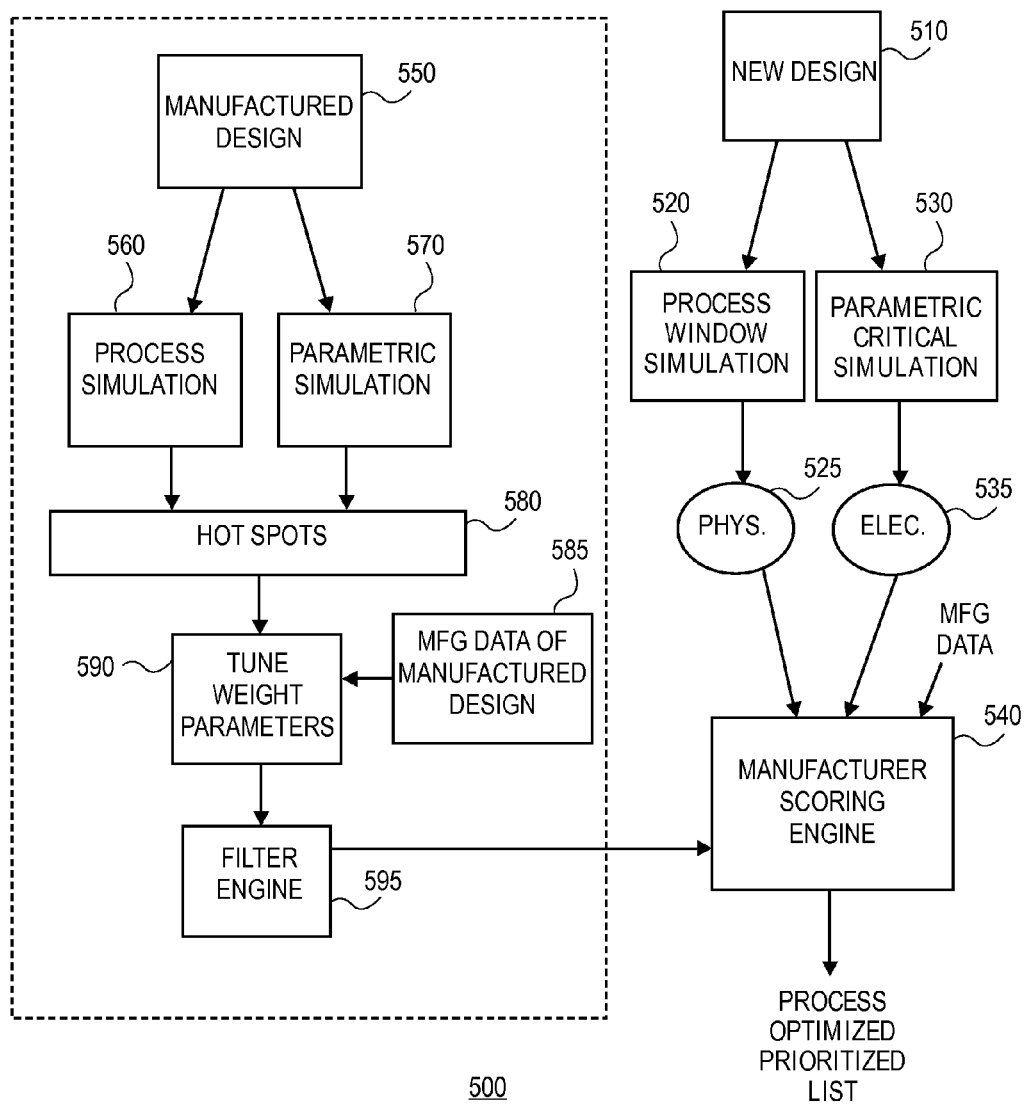
FIG. 5 illustrates a flowchart view of an embodiment of cross domain correlated engine utilized in process optimization.

FIG. 5 illustrates a flowchart 500 view of an embodiment of the cross domain correlation engine located in the process optimization flow 400. The cross domain correlation engine of process optimization 140 is substantially similar to the cross domain correlated engine located in the mask optimization 110 as described above.

In one embodiment, the current mask containing the current layout 510 is simulated. Process Window simulation 520 is performed to determine the possible critical areas determined by the process window 525. Parametric Critical Analysis simulation 530 is performed to determine the possible critical areas determined by the electrical effects 535. The location of the simulated functional hot spots and electrical hot spots for the current layout design are transmitted to the manufacturing scoring engine 540.

Using a previous mask and layout fabricated at the manufacturer 550, a previous layout is also analyzed for hot spots. A process window simulation 560 and parametric critical analysis simulation 570 are performed to determine the location of all the hot spots found during the simulations 580.

Because the layout had already been fabricated, the actual locations of hot spots/failure areas are also known 585. Location information is entered and compared with the location of the simulated hot spots. The weighting parameters are then tuned to match hot spots 590 such that the locations of simulated hot spots are substantially similar to the location of hot spots determined from the actual manufacturing data 585. In one embodiment, weighting parameters are similar to the weighting parameters of cross domain correlation engine 240. In another embodiment, weighting parameters are determined by the user as needed. Once the proper weighting to reproduce the location of the hot spots using the simulations are determined, those weighting values are transmitted to the filter engine 595. The filter engine is used to predict the location of the hot spot locations for the new design 510.

The weighting parameters from the filter engine 595 is sent to the manufacturing scoring engine 540. Similar to the cross domain correlation engine described above, the physical and electrical hot spots from the simulations and manufacturing data are also provided. Using this information combined with the weighting parameters from the manufacturer, a process optimized prioritized list of hot spots is determined for the current layout 510.

Inspection Optimization

Figure 6:
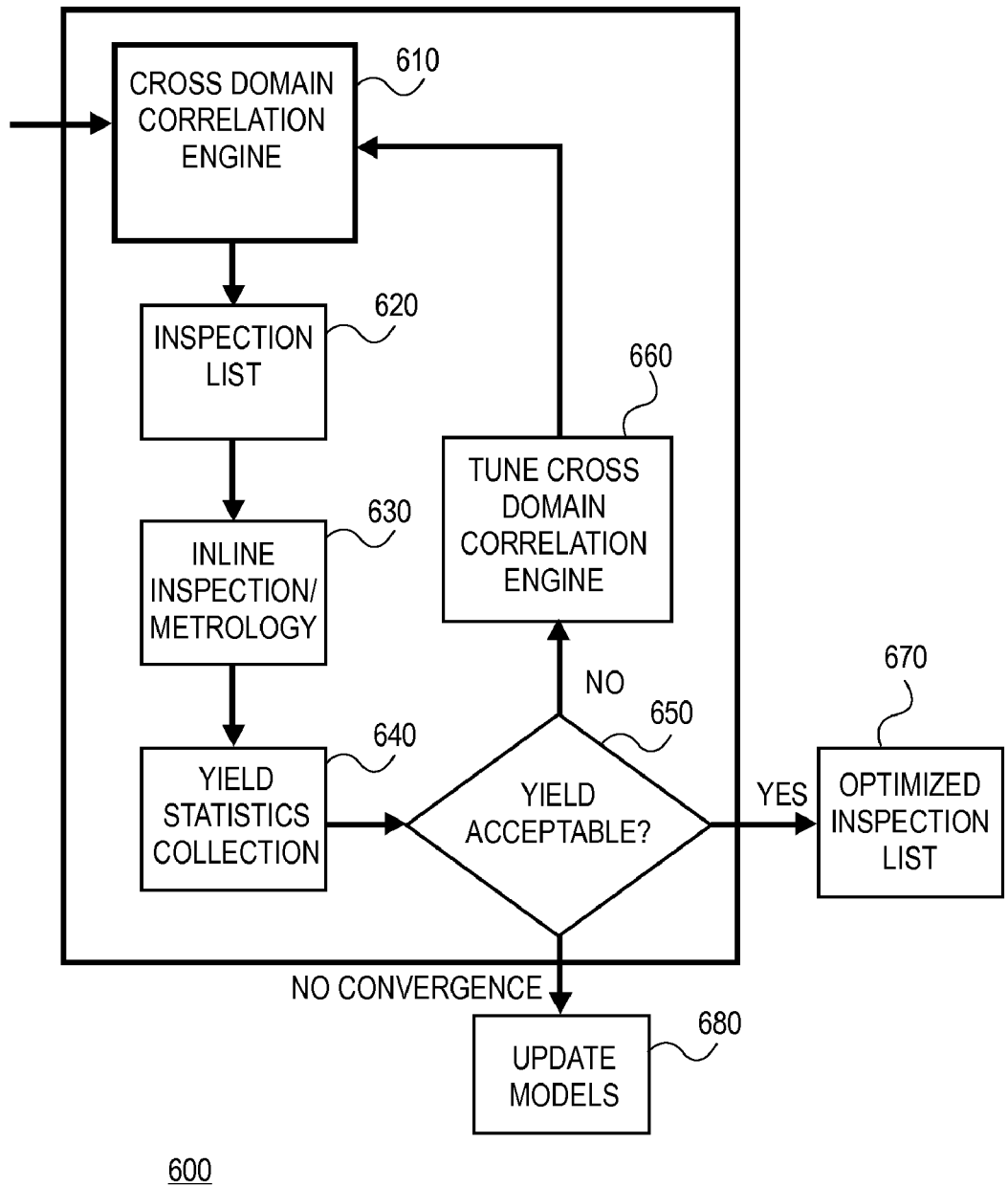
FIG. 6 illustrates a flowchart view of an inspection optimization according to an embodiment.

FIG. 6 illustrates a flowchart 600 view of an inspection optimization according to an embodiment of design for manufacturing process.

FIG. 6 outlines the flow and usage of the Inspection Optimization. In an embodiment, inspection optimization optimizes for parametric and functional yield improvement using optimized inspection lists for in-line semiconductor manufacturing metrology and inspection equipment. Cross-domain correlation, similar to the methods described above, allows for the selection of the most probable locations of parametric and functional critical areas. Inspection optimization 150 provides the detection of suspected physical features associated with electrically sensitive parameters. It is used to provide design based inspection/metrology lists to in-line semiconductor manufacturing metrology/inspection tools. The optimized inspection list is a result of statistically optimizing a correlated cross domain inspection list with a parametric and functional yield baseline.

Inspection optimization 150 includes a cross domain correlation engine 610. Engine 610 is substantially similar to the cross domain correlation engines of mask optimization 110 and process optimization 140. In one embodiment, it uses the hot spots location information and/or the parametric and physical simulation information to produce an inspection list of possible hot spot locations. In one embodiment, the hot spots locations information includes lithography hot spots. In another embodiment, the hot spots locations include parametric hot spots. In a further embodiment, locations of CMP hot spots are provided. Any other hot spots such as design hot spots may be used.

In one embodiment, the cross domain correlation engine 610 produces an inspection list of hot spots 620. In another embodiment, previous hot spot lists may be used. In a further embodiment, inspection lists using hot spot locations determined by the cross domain correlation engines from other portions of the design for manufacturing process flow may be used.

The wafers received from the fab 147 are physically inspected for hot spots using inline inspection/metrology 630. From inline inspection/metrology of the wafers, a production yield is determined and yield statistics are collected 640 and stored.

From the measured 630 hot spot locations provided by the engine 610, a yield correlation is determined. Yield analysis is then performed on using the calculated yield from the inspection list and the actual yield statistics collected. Whether or not the calculated yield is acceptable is determined in 650. If the two yields are different, then the cross domain correlation engine is tuned to produce a better inspection list 660. In one embodiment, the tuning is substantially similar to the tuning of the cross domain correlation engines described above. In another embodiment, weighting parameters are adjusted such that the hot spot locations and yield matches. This information is feedback to other portions of the design for manufacturing process flow for future runs.

Ultimately, the two yields should converge and an optimized inspection list can be produced 670 where the cross domain correlation engine correctly anticipated the location of the hotspot and the yield statistics. If there is no convergence, then the models will have to be updated 680 such that future yield calculations will converge. In an embodiment, process engineers revalidate their process by including some designs that did not converge in the above flow.

Therefore, inspection optimization 150 determines correlated hot spots from multiple design domains and provides the most probable spots of systematic defects. This optimization block provides manufacturing with design based inline inspection points. It cross-correlates hotspots from different design based analysis tools (i.e., Cross Domain Correlation) including physical and electrical domains. The self-tuning of the correlation engine 660 is specific to the particular manufacturing fabrication line to increase the resulting yield. Inspection optimization 150 also provides manufacturing feedback to the design portion of the process, thus allowing adjusting and improving of the design rules. As a result, inspection optimization 150 is a basis for the potential development of manufacturing aware design.

Figure 7:
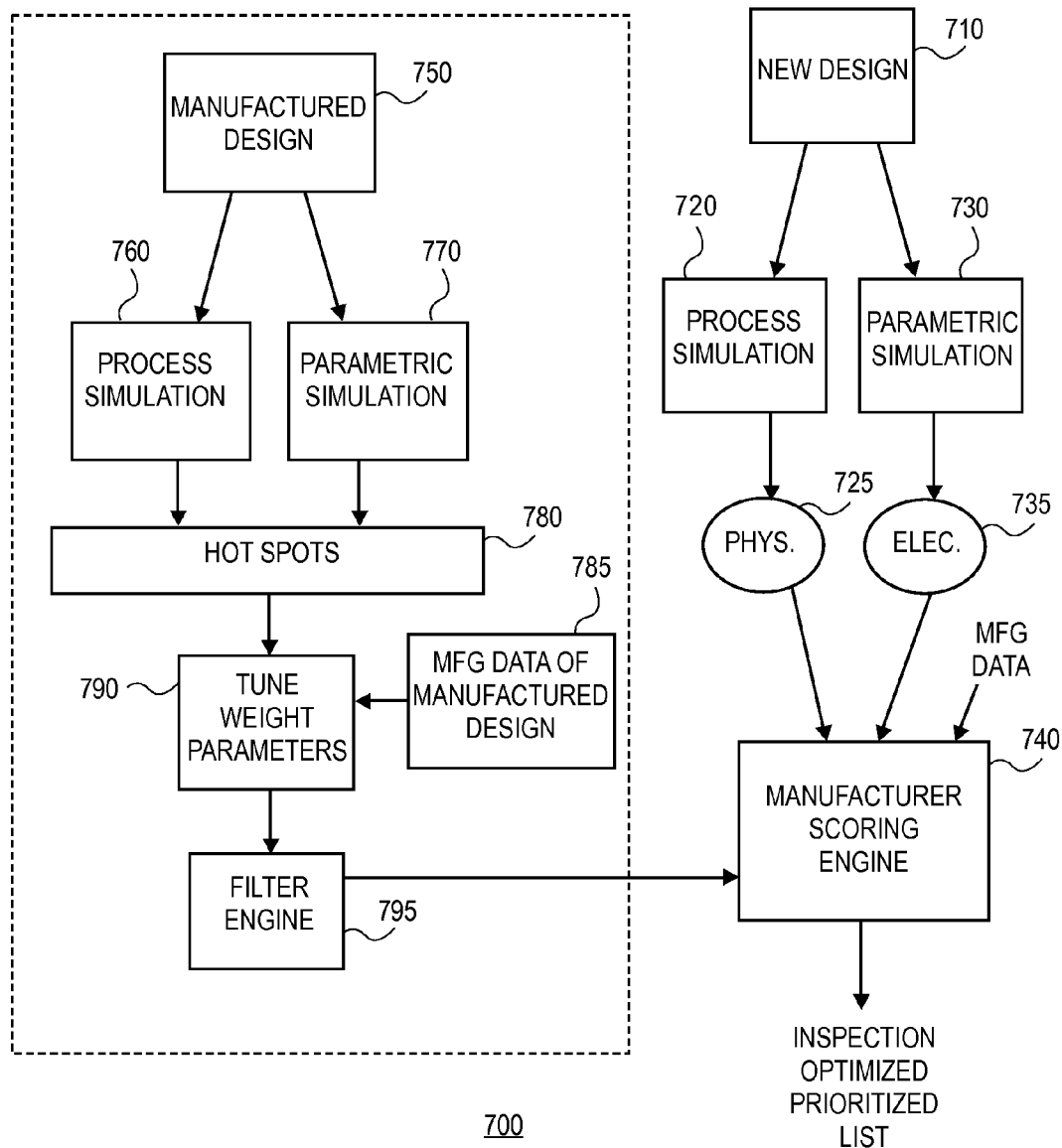
FIG. 7 illustrates a flowchart view of an embodiment of cross domain correlated engine located in inspection optimization.

FIG. 7 illustrates a flowchart 700 view of an embodiment of cross domain correlation engine 610 located in the inspection optimization 150. The cross domain correlation engine 610 functions substantially the similar to the cross domain correlation engines described above.

The physical and electrical effects are performed as described above. Initially multiple process models are used for simulation of the current layout 710. Process simulation 720 is performed to determine the possible critical areas determined by the physical layout 725. Parametric simulation 730 is performed to determine the possible critical areas determined by the electrical characteristics 735. The physical hot spots and electrical hot spots are transmitted to the manufacturing scoring 740.

A previous layout design that has already been fabricated at the manufacturer 750 is also simulated for hot spots. A process simulation 760 and parametric simulation 770 are performed on the manufactured layout to determine all the hot spots found during simulation 780. Because the layout has already been fabricated, the actual hot spots are already known 785.

The actual hot spot location information is provided and compared with the location information of the simulated hot spots. The weighting parameter is tuned to adjust the locations of hot spots 790 such that the locations of simulated hot spots are substantially similar to the locations of hot spots determined from the actual manufacturing data 785.

Once the proper weighting parameters to locate the actual hot spots using the simulations are determined, those weighting values are transmitted to the filter engine 795. The filter engine 795 now has the weighting information to predict the locations of the actual hot spots similar to the filter engines 395, 595 described above. The weighting parameters from the filter engine 795 is provided to the manufacturing scoring engine 740. The physical and electrical hot spots information from the simulations and the manufacturing data are also provided to the manufacturer scoring engine. Using the weighting parameters and the manufacturing data from the manufacturer with the simulated functional and parametric effects information, an inspection optimized prioritized list of hot spot locations is determined for the current layout 710.

System Overview

Figure 8:
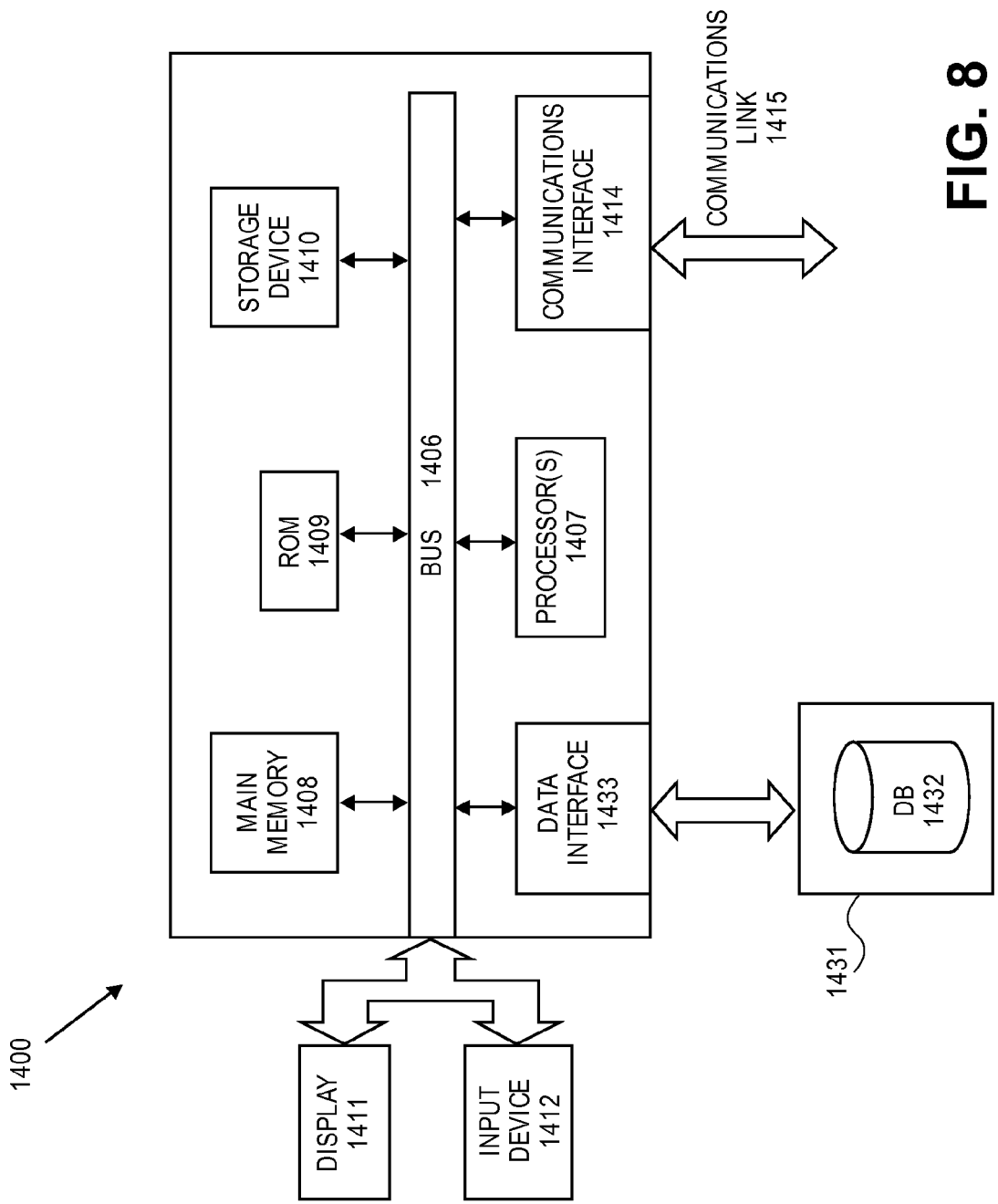
FIG. 8 is a block diagram of an illustrative computing system suitable for implementing an embodiment.

FIG. 8 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The different aspects of the optimization processes disclosed in co-pending, U.S. application Ser. Nos. 11/612,422, 11/612 439, 11/612,446, all filed on Dec. 18, 2006, which are all incorporated herein by reference in their entirety.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

The invention claimed is:

1. A computer-implemented method for process optimization after mask manufacturing comprising:
generating a first list of critical areas simulated from a manufactured mask containing a design layout based at least in part upon cross domain correlation, wherein the cross domain correlation comprises correlating the critical areas caused by physical and electrical effects with weighing factors from a manufacturer, wherein the weighting factors are tuned to match locations of actual critical areas of a previous layout with locations of simulated critical areas of the same previous layout;

applying a priority for process optimization for the critical areas;

determining, by using a processor, a manufacturing process recipe based at least in part upon the priority, wherein the manufacturing process recipe is determined based at least in part upon comparing a prediction of functional and parametric yields with a threshold in order to optimize a process control for the functional and parametric yields; and storing the manufacturing process recipe in a volatile or non-volatile computer-usable medium or displaying the manufacturing process recipe using a display device.

2. The method of claim 1, further comprising updating process settings of a combined process window if a production yield is below a threshold.

3. The method of claim 2, wherein the act of updating comprises generating a second list of critical areas associated with the combined process window.

4. The method of claim 1, further comprising providing the manufacturing process recipe to be used for fabrication if a product yield is above a threshold.

5. The method of claim 1, wherein process window information and parametric effects information are used for the determining of the first list of critical areas, wherein process window information comprises possible critical areas determined by a process window and parametric effects information comprises possible critical areas determined by electrical effects.

6. The method of claim 1, further comprising optimizing a mask if a production yield is below a required value.

7. The method of claim 1, wherein the critical areas are determined by prioritizing hot spots based at least in part upon production yield.

8. An apparatus for process optimization after mask manufacturing comprising:

a processor configured for:
    generating a first list of critical areas simulated from a manufactured mask containing a design layout based at least in part upon cross domain correlation, wherein the cross domain correlation comprises correlating the critical areas caused by physical and electrical effects with weighing factors from a manufacturer, wherein the weighting factors are tuned to match locations of actual critical areas of a previous layout with locations of simulated critical areas of the same previous layout;
    applying a priority for process optimization for the critical areas;
    determining a manufacturing process recipe based at least in part upon the priority, wherein the manufacturing process recipe is determined based at least in part upon comparing a prediction of functional and parametric yields with a threshold in order to optimize a process control for the functional and parametric yields; and
a volatile or non-volatile computer-usable medium for storing the manufacturing process recipe or a display device for displaying the manufacturing process recipe.

9. The apparatus of claim 8, further comprising means for updating process settings of a combined process window if a production yield is below a threshold.

10. The apparatus of claim 9, wherein the means for updating comprises means for generating a second list of critical areas associated with the combined process window.

11. The apparatus of claim 8, further comprising means for providing the manufacturing process recipe to be used for fabrication if a product yield is above a threshold.

12. The apparatus of claim 8, wherein process window information and parametric effects information are used for the determining of the first list of critical areas, wherein process window information comprises possible critical areas determined by a process window and parametric effects information comprises possible critical areas determined by electrical effects.

13. The apparatus of claim 8, further comprising means for optimizing a mask if a production yield is below a required value.

14. The apparatus of claim 8, wherein the critical areas are determined by prioritizing hot spots based at least in part upon production yield.

15. A computer program product comprising a non-transitory computer-usable storage medium having executable code which, when executed by a processor, causes the processor to execute a process for process optimization after mask manufacturing, comprising:

generating a first list of critical areas simulated from a manufactured mask containing a design layout based at least in part upon cross domain correlation, wherein the cross domain correlation comprises correlating the critical areas caused by physical and electrical effects with weighing factors from a manufacturer, wherein the weighting factors are tuned to match locations of actual critical areas of a previous layout with locations of simulated critical areas of the same previous layout;

applying a priority for process optimization for the critical areas; and determining a manufacturing process recipe based at least in part upon the priority, wherein the manufacturing process recipe is determined based at least in part upon comparing a prediction of functional and parametric yields with a threshold in order to optimize a process control for the functional and parametric yields; and storing the manufacturing process recipe or displaying the manufacturing process recipe on a display device.

16. The computer program product of claim 15, further comprising updating process settings of a combined process window if a production yield is below a threshold.

17. The computer program product of claim 16, wherein the act of updating comprises generating a second list of critical areas associated with the combined process window.

18. The computer program product of claim 15, further comprising providing the manufacturing process recipe to be used for fabrication if a product yield is above a threshold.

19. The computer program product of claim 15, wherein process window information and parametric effects information are used for the determining of the first list of critical areas, wherein process window information comprises possible critical areas determined by a process window and parametric effects information comprises possible critical areas determined by electrical effects.

20. The computer program product of claim 15, further comprising optimizing a mask if a production yield is below a required value.

21. The computer program product of claim 15, wherein the critical areas are determined by prioritizing hot spots based at least in part upon production yield.

* * * * *